US012796226B2

(12) United States Patent
Zhang et al.

(10) Patent No.: US 12,796,226 B2
(45) Date of Patent: Nov. 10, 2026

(54) DISPLAY PANEL AND DISPLAY APPARATUS

(71) Applicant: Hefei Visionox Technology Co., Ltd., Hefei (CN)

(72) Inventors: Jishuai Zhang, Hefei (CN); Wenxing Li, Hefei (CN); Xuan Zhao, Hefei (CN); Mingxing Liu, Hefei (CN); Xuyang Fang, Hefei (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 599 days.

(21) Appl. No.: 17/992,231

(22) Filed: Nov. 22, 2022

(65) Prior Publication Data

US 2023/0083811 A1 Mar. 16, 2023

Related U.S. Application Data

(63) Continuation of application No. PCT/CN2021/103317, filed on Jun. 29, 2021.

(30) Foreign Application Priority Data

Aug. 31, 2020 (CN) ......................... 202010894103.2

(51) Int. Cl.
*H10K 59/122* (2023.01)
*H10K 59/35* (2023.01)
*H10K 59/60* (2023.01)

(52) U.S. Cl.
CPC ......... *H10K 59/122* (2023.02); *H10K 59/353* (2023.02); *H10K 59/60* (2023.02)

(58) Field of Classification Search
None
See application file for complete search history.

(56) References Cited

U.S. PATENT DOCUMENTS 10,901,257 B2 * 1/2021 Li ..................... G02F 1/133514
2010/0207851 A1 * 8/2010 Cok ..................... G09G 3/3208
345/82

(Continued)

FOREIGN PATENT DOCUMENTS

CN 109061934 A * 12/2018 ......... G02F 1/13394
CN 109065588 A 12/2018

(Continued)

OTHER PUBLICATIONS

International Search Report issued on Sep. 13, 2021, in corresponding PCT Application No. PCT/CN2021/103317, 7 pages.

(Continued)

*Primary Examiner* — Fatima N Farokhrooz
(74) *Attorney, Agent, or Firm* — Maier & Maier, PLLC

(57) ABSTRACT

A display panel and a display apparatus. The display panel includes a first display area including a light-transmitting display area. The display panel includes: a substrate; a pixel definition layer disposed on the substrate; a plurality of first spacers disposed on a side of the pixel definition layer facing away from the substrate, the first spacers being positioned in the first display area; a cover plate disposed on a side of the first spacers facing away from the substrate. The first display area includes at least two sub-areas sequentially arranged along a direction from center to edge. In one of the sub-areas on the substrate to an area of the one of sub-areas is different from another proportion of a total area of orthographic projections of first spacers in another one of the sub-areas to an area of the another one of the sub-areas.

16 Claims, 8 Drawing Sheets

(56) References Cited

U.S. PATENT DOCUMENTS

| | | | | |
|---|---|---|---|---|
| 2013/0162939 | A1 * | 6/2013 | Kobayashi | G02F 1/13394 349/155 |
| 2014/0055735 | A1 | 2/2014 | Oono et al. | |
| 2019/0064572 | A1 * | 2/2019 | Park | G02F 1/133371 |
| 2020/0103690 | A1 * | 4/2020 | Wu | G02F 1/13394 |
| 2020/0110298 | A1 * | 4/2020 | Li | G02F 1/13338 |
| 2021/0043867 | A1 * | 2/2021 | Gao | H10K 59/874 |
| 2022/0158117 | A1 * | 5/2022 | Chang | H10K 59/121 |
| 2025/0244320 | A1 * | 7/2025 | Chou | G16B 25/00 |

FOREIGN PATENT DOCUMENTS

| | | | | | |
|---|---|---|---|---|---|
| CN | 109545826 | A | | 3/2019 | |
| CN | 109546003 | A | | 3/2019 | |
| CN | 208672989 | U | | 3/2019 | |
| CN | 109856840 | A | * | 6/2019 | G02F 1/13338 |
| CN | 111129103 | A | * | 5/2020 | H01L 247/3234 |
| CN | 111244112 | A | * | 6/2020 | H10D 86/0212 |
| CN | 111261033 | A | | 6/2020 | |
| CN | 111290154 | A | | 6/2020 | |
| CN | 211826807 | U | | 10/2020 | |
| CN | 111968517 | A | | 11/2020 | |
| JP | 2001092121 | A | * | 4/2001 | |
| WO | WO-2018166213 | A1 | * | 9/2018 | H01L 27/3246 |

OTHER PUBLICATIONS

Office Action issued on Sep. 2, 2021, in corresponding Chinese Application No. 202010894103.2, 24 pages.

Office Action issued on Nov. 26, 2021, in corresponding Chinese Application No. 202010894103.2, 34 pages.

Office Action issued on Jan. 29, 2022, in corresponding Chinese Application No. 202010894103.2, 34 pages.

Office Action issued on Apr. 27, 2022, in corresponding Chinese Application No. 202010894103.2, 10 pages.

Office Action issued on Sep. 7, 2022, in corresponding Chinese Application No. 202010894103.2, 2 pages.

* cited by examiner

Q1

Q1

First proportion 3.20%

First proportion 3.45%

First proportion 3.60%

First proportion 4.07%

DISPLAY PANEL AND DISPLAY APPARATUS

CROSS-REFERENCE TO RELATED APPLICATIONS

This application is a continuation of International Application No. PCT/CN2021/103317, filed on Jun. 29, 2021, which claims priority to Chinese Patent Application No. 202010894103.2, filed on Aug. 31, 2020, both of which are hereby incorporated by reference in their entireties.

TECHNICAL FIELD

The present application relates to the technical field of display, and in particular to a display panel and a display apparatus.

BACKGROUND

With the rapid development of electronic devices, the requirements of users on screen-to-body ratios become higher and higher. Thus, full-screen electronic devices are receiving more and more attention in the industry. Conventional electronic devices, such as cell phones, tablet computers, etc. require integration of components such as front cameras, earphones, and infrared sensing elements. However, in improvement of a light transmittance of an electronic device, generally, a strength of a display panel is deteriorated, thereby affecting the quality of the display panel.

SUMMARY

In one aspect, embodiments of the present application provide a display panel including a first display area including a light-transmitting display area. The display panel includes: a substrate; a pixel definition layer disposed on the substrate; a plurality of first spacers disposed on a side of the pixel definition layer facing away from the substrate, the first spacers being positioned in the first display area; a cover plate on a side of the first spacers facing away from the substrate. The first display area includes at least two sub-areas sequentially arranged along a direction from center to edge of the first display area, and a proportion of a total area of orthographic projections of first spacers in each of the sub-areas on the substrate to an area of the sub-area is distinct.

In another aspect, the embodiments of the present application further provide a display apparatus including the display panel according to any one of the embodiments in the one aspect of the present application.

The embodiments of the present application provide the display panel and the display apparatus, which facilitate the under-screen integration of photosensitive components, improve the screen-to-body ratio, and ensure a desired overall strength of the display panel.

BRIEF DESCRIPTION OF THE DRAWINGS

Features, advantages and technical effects of exemplary embodiments of the present application will be described below with reference to the accompanying drawings, which are not drawn to scale.

DETAILED DESCRIPTION

Figure 1:
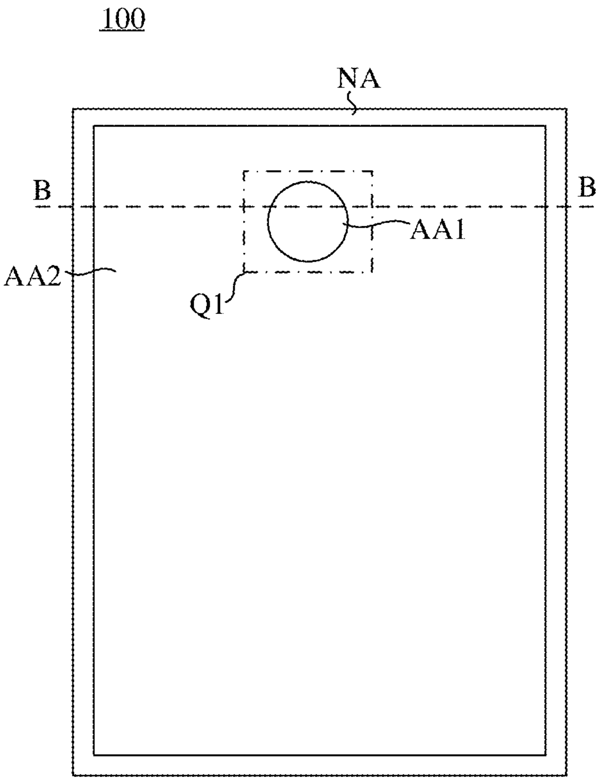
FIG. 1 is a top view of a display panel according to an embodiment of the present application.

Features and exemplary embodiments of various aspects of the present application are described in detail below. In the following detailed description, numerous specific details are set forth in order to provide a thorough understanding of the present application. However, it will be apparent to those skilled in the art that the present application may be practiced without some of these specific details. The following description of the embodiments is merely intended to provide a better understanding of the application by illustrating examples of the present application. In the drawings and the following description, at least some well-known structures and techniques have not been shown in order to avoid unnecessarily obscuring the present application. In addition, the dimensions of some of the structures may be exaggerated for clarity. Furthermore, the features, structures, or characteristics described below may be combined in any suitable manner in one or more embodiments.

For a better understanding of the present application, a display panel and a display apparatus provided by the implementations of the present application will be described in detail with reference to the accompanying drawings.

In an electronic device such as a mobile phone or a tablet, photosensitive components (e.g., a front camera, an infrared light sensor, and a proximity light sensor) are required to be integrated on a side of a display panel. In some embodiments, a light-transmitting display area may be provided in the above-described electronic device, and the photosensitive components may be arranged on a backside of the light-transmitting display area, so that all-screen display by the electronic device can be realized while the proper operation of the photosensitive components being ensured.

Generally, the display panel is provided with spacers (SPCs) to improve the overall strength of the display panel. However, the arrangement of the spacers may affect a light transmittance of the light-transmitting display area of the display panel. In order to increase the light transmittance of the light-transmitting display area, arrangement of the spacers may be reduced. For example, an area of a spacer is reduced, or the number of spacers is reduced. However, when the arrangement of the spacers is reduced, the support strength of the light-transmitting display area is also reduced, which is likely to cause a large deformation of the cover plate in the first display area (which includes the light-transmitting display area), so that there is an optical path difference between different light beams when they are reflected on the cover plate. Therefore, it is likely to lead to a poor display effect by the display panel, such as a Newton's ring. Therefore, while the light transmittance of the display panel is improved, the arrangement of the spacers should also be comprehensively considered.

In order to solve the above problems, the embodiments of the present application provide a display panel 100 and a display apparatus. The display panel 100 and the display apparatus provided by the embodiments of the present application will be described in detail with reference to the accompanying drawings.

Figure 2:
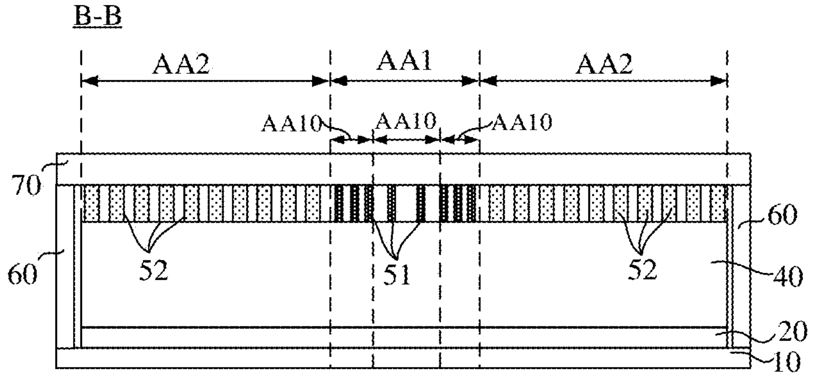
FIG. 2 is a cross-sectional view taken along the direction B-B in FIG. 1.

Reference is made to FIG. 1 and FIG. 2. FIG. 1 is a top view of a display panel according to an embodiment of the present invention, and FIG. 2 is a cross-sectional view taken along the line B-B in FIG. 1. As shown in FIG. 1, the display panel 100 provided by the embodiments of the present application includes a first display area AA1. The first display area AA1 includes a light-transmitting display area, which facilitates the integration of photosensitive components in the first display area AA1, and improves the screen-to-body ratio of the display panel 100. The first display area AA1 may be a light-transmitting display area, and the areas of the first display area AA1 and the light-transmitting display area may exactly overlap. Of course, the first display area AA1 may also include other areas than the light-transmitting display area.

The display panel 100 includes a substrate 10, a pixel definition layer 40, first spacers 51, and a cover plate 70. The pixel definition layer 40 is positioned on the substrate 10. The first spacers 51 are positioned on a side of the pixel definition layer 40 facing away from the substrate 10. The first spacers 51 are positioned in the first display area AA1. The cover plate 70 is positioned on a side of the first spacers 51 facing away from the substrate 10. The first display area AA1 includes at least two sub-areas AA10 sequentially arranged along a direction from a center to edges of the first display area AA1. A proportion of a total area of orthographic projections of first spacers 51 in each sub-area AA10 on the substrate 10 to an area of the sub-area AA10 is distinct. For example, the first display area AA1 includes three sub-areas AA10 sequentially arranged along a direction from a center to edges of the first display area AA1, including a first sub-area, a second sub-area and a third sub-area. A proportion of a total area of orthographic projections of first spacers 51 in the first sub-area on the substrate 10 to an area of the first sub-area may be a first proportion, a proportion of a total area of orthographic projections of first spacers 51 in the second sub-area on the substrate 10 to an area of the second sub-area may be a second proportion, and a proportion of a total area of orthographic projections of first spacers 51 in the third sub-area on the substrate 10 to an area of the third sub-area may be a third proportion. The first proportion, the second proportion and the third proportion may be different from one another.

In the embodiments of the present application, a light transmittance of the first display area AA1 (that is, the light-transmitting display area) may be greater than or equal to 15%. To ensure that the light transmittance of the first display area AA1 is greater than 15%, greater than 40%, or even greater, a light transmittance of at least some of functional film layers of the display panel 100 in the embodiments is greater than 80%, and a light transmittance of at least some of the functional film layers is even greater than 90%.

In the display panel 100 provided by the embodiments of the present application, it is appropriated arranged that the proportion of the total area of the orthographic projections of the first spacers 51 in each sub-area AA10 on the substrate 10 to the area of the sub-area AA10 is distinct, a desired light transmittance of the first display area AA1 can be ensured and a desired support strength of the first display area AA1 can be ensured at the same time. In contrast to the arrangement where the first spacers 51 are uniformly arranged in the first display area AA1, in the display panel 100 of the embodiments of the present application, the effects of the first spacers 51 on the light transmittance and the support strength can be balanced, and the screen-to-body ratio is improved and the overall strength of the display panel 100 is improved at the same time, which prevents the Newton's ring from being generated due to the support strength of the first display area AA1 being lower than the support strength of an edge encapsulation structure (for example, a Frit encapsulation structure) or the support strength of other display area being low.

In some embodiments, the display panel 100 may further include a second display area AA2 adjoining the first display area AA1. A light transmittance of the second display area AA2 is less than the light transmittance of the first display area AA1, so that the second display area AA2 can have a better display effect. In some embodiments, the display panel 100 further includes a non-display area NA surrounding the first display area AA1 and the second display area AA2. In contrast to the display panel in which the photosensitive components are arranged in the non-display area NA, in the display panel 100 provided by these embodiments of the present application, the first display area AA1 are configured as capable of transmitting light, so that the display panel 100 can effectively improve the screen-to-body ratio and facilitate the full-screen display.

On this basis, the display panel 100 further includes second spacers 52 disposed between the pixel definition layer 40 and the cover plate 70. The second spacers 52 are positioned in the second display area AA2. A proportion of a total area of orthographic projections of the first spacers 51 in the first display area AA1 on the substrate 10 to an area of the first display area AA1 is a first proportion, and a proportion of a total area of orthographic projections of the second spacers 52 in the second display area AA2 on the substrate 10 to an area of the second display area AA2 is a second proportion. The first proportion is less than the second proportion. With the above arrangement, the influence of the first spacers 51 on the light transmittance of the first display area AA1 can be reduced, which effectively improves the light transmittance of the first display area AA1. With the arrangement of the first spacers 51 and the second spacers 52, the strength and the pressure resistance of the display panel 100 can be improved, and the display panel 100 can be kept from problems of poor display effects such as Moire pattern.

By providing the first spacers 51 in the first display are AA1 and the second spacers 52 in the second display area AA2, on the one hand, the first spacers 51 and the second spacers 52 can prevent the photomask from scratching the already prepared film in the display panel 100 when vapor deposition is performed on other film structures of the display panel 100 using the photomask. For example, the first spacers 51 and the second spacers 52 can prevent the photomask from damaging the already prepared light-emitting structure in the preparation of the light-emitting structures of the sub-pixels. On the other hand, the first spacers 51 and second spacers 52 can support the cover plate 70, increase the strength of the display panel 100, prevent the cover plate 70 from being deformed or prevent the display panel 100 from being deformed when subjected to external stress. The constituent material of the first spacers 51 includes photosensitive siloxane (PSPDO) or photosensitive polyimide photoresist (PSPI), and the constituent material of the second spacers 52 include photosensitive siloxane or photosensitive polyimide photoresist. The materials of the first spacers 51 and the second spacers 52 may be the same, and the first spacers 51 and the second spacers 52 may be manufactured simultaneously, simplifying the manufacturing process of the display panel 100.

In some embodiments, along the direction from center to edge of the first display area AA1, the proportion of the total area of the orthographic projections of the first spacers 51 in each sub-area AA10 on the substrate 10 to the area of the sub-area AA10 decreases or increases. With the above arrangement, the proportion of the total area of the orthographic projections of the first spacers 51 in each sub-area AA10 on the substrate 10 to the area of the sub-area AA10 can be flexibly configured, and the overall support strength of the first spacers 51 in the first display area AA1 can be improved and a desired light transmittance of the first display area AA1 can be ensured at the same time. In an optional embodiment, along the direction from center to edge of the first display area AA1, the first display area AA1 includes a first sub-area, a second sub-area and a third sub-area. A proportion of a total area of orthographic projections of first spacers in the first sub-area on the substrate to an area of the first sub-area is a first proportion. A proportion of a total area of orthographic projections of first spacers in the second sub-area on the substrate to an area of the second sub-area is a second proportion. A proportion of a total area of orthographic projections of first spacers in the third sub-area on the substrate to an area of the third sub-area is a third proportion. The first proportion is greater than the second proportion and the second proportion is greater than the third proportion; or, the first proportion is less than the second proportion and the second proportion is less than the third proportion.

In some embodiments, along the direction from center to edge of the first display area AA1, each sub-area AA10 includes an annular area centered on the center of the first display area AA1, and along the direction from center to edge of the first display area AA1, each annular area has a same width. With the above arrangement, the proportion of the total area of the orthographic projections of the first spacers 51 in each sub-area AA10 on the substrate 10 to the area of the sub-area AA10 can be regularly configured, and the overall support strength of the first spacers 51 in the first display area AA1 can be improved and a desired light transmittance of the first display area AA1 can be ensured at the same time.

In a specific implementation, along the direction from center to edge of the first display area AA1, the proportion of the total area of the orthographic projections of the first spacers 51 in each sub-area AA10 on the substrate 10 to the area of the sub-area AA10 decreases. Through a force analysis, it can be seen that, a deformation amount of a portion of the cover plate 70 at the center of the first display area AA1 is relatively large, and a deformation amount of a portion of the cover plate 70 at the edge of the first display area AA1 is relatively small since the edge of the first display area AA1 is connected with the second display area AA2. The above arrangement provided by these embodiment of the present application can effectively improve the support strength of the first display area AA1 and reduce the deformation amount of the cover plate 70 in the first display area AA1, thereby effectively improving the poor display effects of Newton's ring and the like.

Alternatively, in another example, along the direction from center to edge of the first display area AA1, the proportion of the total area of the orthographic projections of the first spacers 51 in each sub-area AA10 on the substrate 10 to the area of the sub-area AA10 increases. With the above arrangement, the light transmittance at the center of the first display area AA1 is made large, facilitating integration of the photosensitive components in the central area of the first display area AA1.

In some embodiments, the side of the first spacers 51 facing away from the substrate 10 and the side of the second spacers 52 facing away from the substrate 10 are flush in a thickness direction of the display panel 100. With the above arrangement, the Newton's ring generated due to the inappropriate arrangement of the first spacers 51 and the second spacers 52 can be effectively prevented, and at the same time, the pressure resistance of the display panel 100 can be made uniform.

Figure 3:
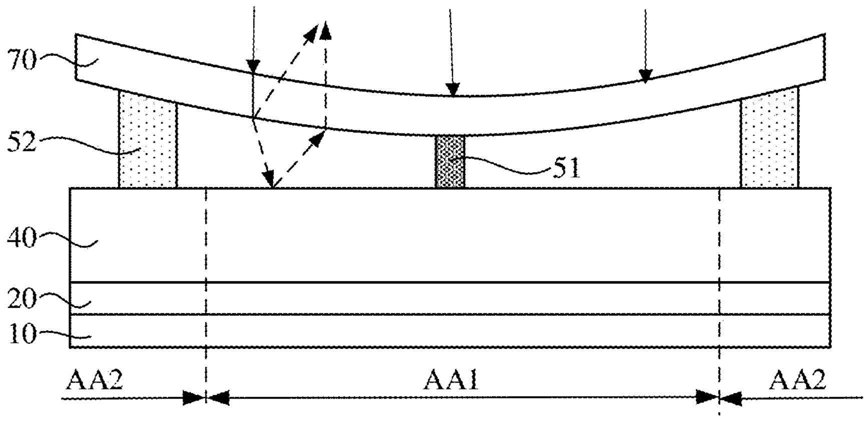
FIG. 3 is a schematic cross-sectional view of a display panel provided by a comparative example 1.

In order to explain that the display panel 100 provided by the embodiments of the present application can effectively improve the Newton's ring phenomenon, the following description will be made with reference to a comparative example 1 shown in FIG. 3. FIG. 3 is a schematic cross-sectional view of a display panel provided by the comparative example 1, in which solid lines with arrows and dotted lines with arrows are schematic representations of transmission paths of light. The arrangement of the first spacer 51 and the second spacer 52 in FIG. 3 is not appropriate, and the support strength of the first display area AA1 is weaker than that of the second display area AA2. When the display panel 100 is a rigid display panel and the display panel 100 includes the cover plate 70, a depression amount of the first spacer 51 tends to be greater than a depression amount of the second spacer 52 under the gravity of the cover plate 70 and the atmospheric pressure. In the first display area AA1, the cover plate 70 is recessed toward the substrate 10, so that a microcavity formed by the cover plate 70 and the pixel definition layer 40 is changed. When a light ray is incident on the surface of the cover plate 70, there is an optical path difference between the light ray reflected by the surface of the cover plate 70 and the light ray reflected by the surface of the pixel definition layer 40, and the reflected light rays interfere with each other. Therefore, the display panel 100 shown in the comparative example 1 generates a stripe-like Newton's ring phenomenon.

In contrast, in the display panel 100 provided by the embodiments of the present application, as shown in FIG. 2, the side of the first spacers 51 facing away from the substrate 10 and the side of the second spacers 52 facing away from the substrate 10 are flush in the thickness direction of the display panel 100, so that the interference between the light ray reflected by the surface of the cover plate 70 and the light ray reflected by the surface of the pixel definition layer 40 is reduced, thereby effectively improving the Newton's ring.

In some embodiments, the display panel 100 further includes an encapsulation structure 60. The side of the first spacers 51 facing away from the substrate 10, the side of the second spacers 52 facing away from the substrate 10 and a side of the encapsulation structure 60 facing away from the substrate 10 are flush in the thickness direction of the display panel 100, which can effectively prevent the Newton's ring from being generated due to the non-uniform height of the spacers and the encapsulation structure 60.

In order to realize that the proportion of the total area of the orthographic projections of the first spacers 51 in each sub-area AA10 on the substrate 10 to the area of the sub-area decreases along the direction from center to edge of the first display area AA1, in some embodiments, an area of an orthographic projection of a first spacer 51 on the substrate 10 decreases along the direction from center to edge of the first display area AA1; and/or a number of first spacers 51 per unit area decreases along the direction from center to edge of the first display area AA1.

For example, along the direction from center to edge of the first display area AA1, the area of the orthographic projection of the first spacer 51 on the substrate 10 decreasing may be implemented in a manner in which, along the direction from center to edge of the first display area AA1, an area of an orthographic projection of a first spacer 51 in a sub-area AA10 on the substrate 10 decreases relative to an adjacent sub-area AA10, and in a same sub-area AA10, an area of an orthographic projection of each first spacer 51 on the substrate 10 is the same. In this case, two types of first spacers 51 with different areas of the orthographic projections on the substrate 10 may be fabricated on the pixel definition layer 40, where the fabrication is easy. Alternatively, it may be arranged that the area of the orthographic projection of each first spacer 51 on the substrate 10 decreases along the direction from center to edge of the first display area AA1.

Figure 4:
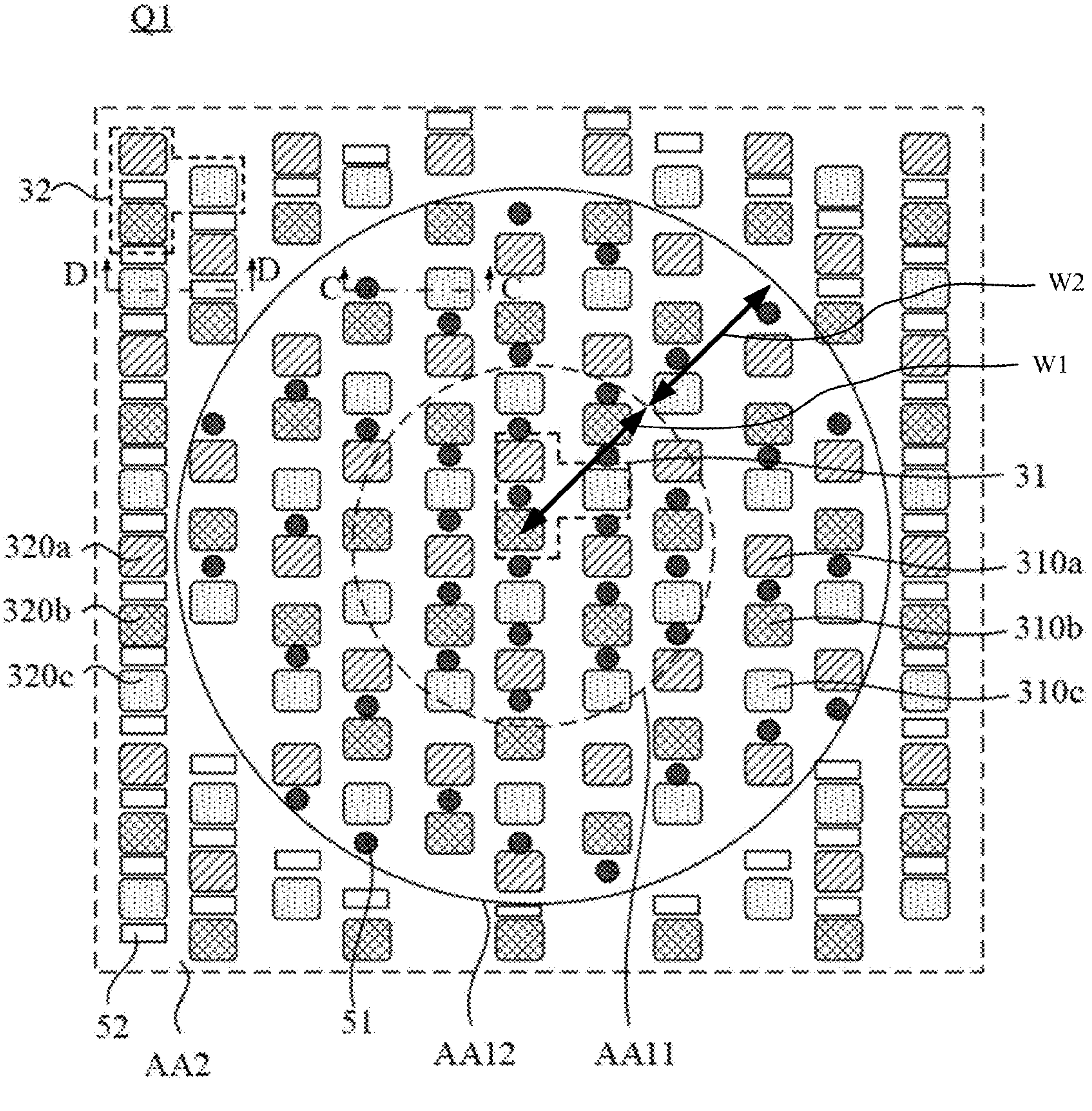
FIG. 4 is an enlarged schematic view of an example of an internal structure of a display panel at Q1 shown in FIG. 1.
Figure 5:
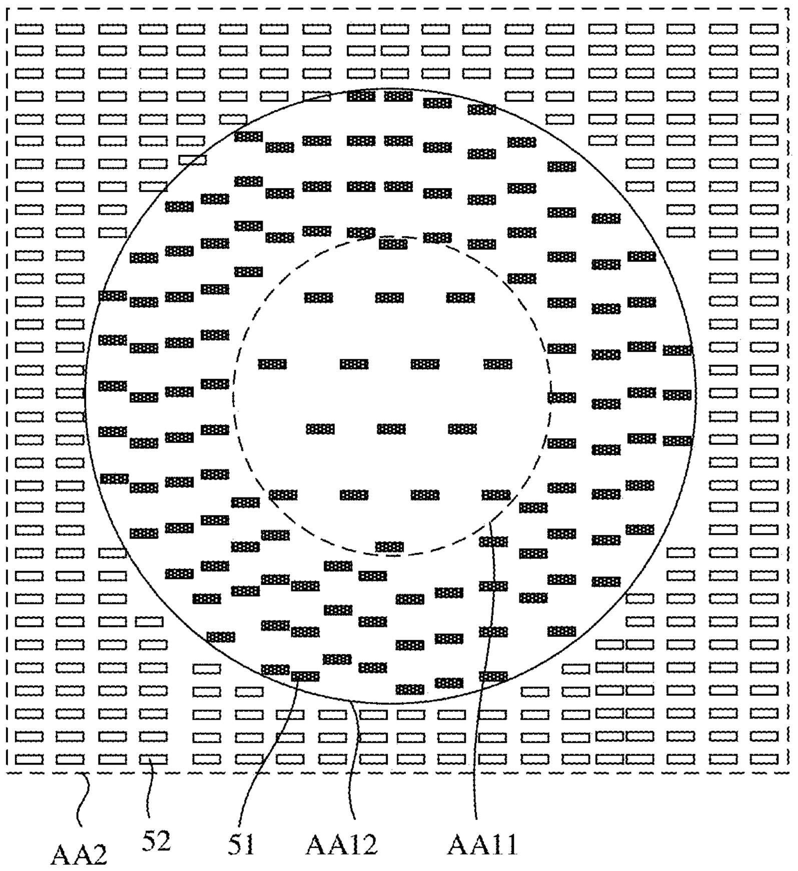
FIG. 5 is an enlarged schematic view of another example of an internal structure of the display panel at Q1 shown in FIG. 1.
Figure 6:
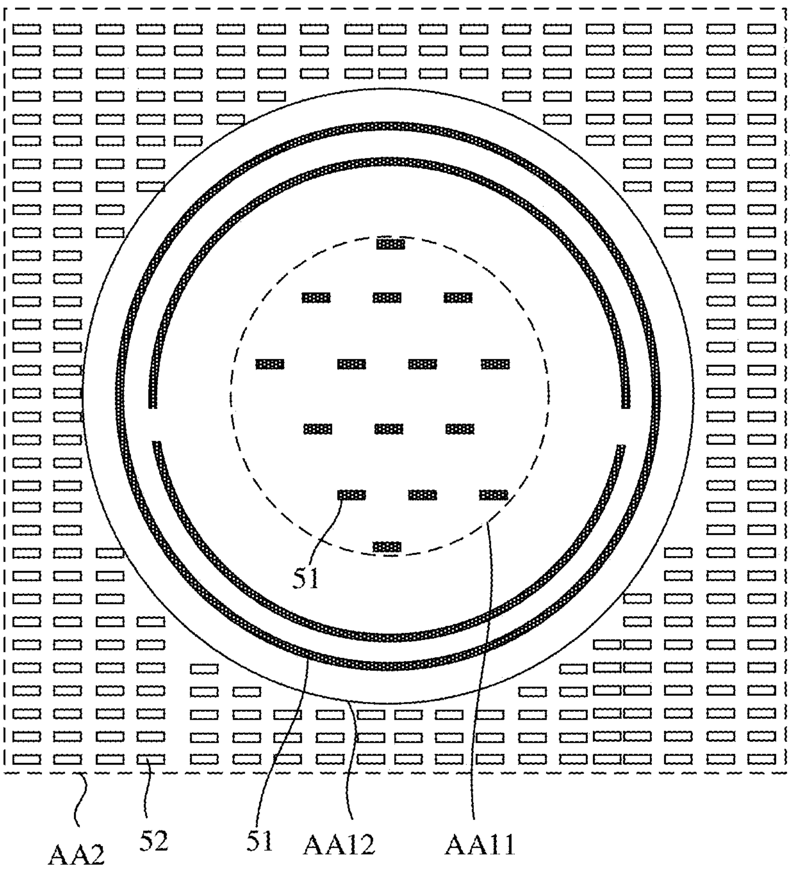
FIG. 6 is an enlarged schematic view of yet another example of an internal structure of the display panel at Q1 shown in FIG. 1.

FIG. 4 is an enlarged schematic view of an example of an internal structure of a display panel at Q1 shown in FIG. 1. FIG. 5 is an enlarged schematic view of another example of an internal structure of the display panel at Q1 shown in FIG. 1. FIG. 6 is an enlarged schematic view of yet another example of an internal structure of the display panel at Q1 shown in FIG. 1.

As shown in FIG. 4, in some embodiments, the first display area AA1 includes a first central sub-area AA11 and a first edge sub-area AA12 surrounding the first central sub-area AA11. A proportion of a total area of orthographic projections of first spacers 51 of the first central sub-area AA11 on the substrate 10 to an area of the first central sub-area AA11 is greater than a proportion of a total area of orthographic projections of first spacers 51 in the first edge sub-area AA12 on the substrate 10 to an area of the first edge sub-area AA12. By appropriately arranging the first central sub-area AA11 and the first edge sub-area AA12, the first spacers 51 in each sub-area AA10 can function as an effective support, and the supporting strength in each direction in each sub-area AA10 is uniform. According to a support stress analysis, by arranging the proportion of the total area of the orthographic projections of the first spacers 51 in the first central sub-area AA11 on the substrate 10 to the area of the first central sub-area AA11 to be large, the first spacers 51 in the first central sub-area AA11 can effectively support the cover plate 70, preventing the cover plate 70 greatly deformed in the first display area AA1, thereby making the support strengths of the first display area AA1 and the second display area AA2 similar.

As shown in FIG. 5, in some embodiments, in order to effectively increase the pressure resistance of the first display area AA1, the first display area AA1 includes a first central sub-area AA11 and a first edge sub-area AA12 surrounding the first central sub-area AA11. A proportion of a total area of orthographic projections of first spacers 51 in the first central sub-area AA11 on the substrate 10 to an area of the first central sub-area AA11 is from 0% to 4.8%, and a proportion of a total area of orthographic projections of first spacers 51 in the first edge sub-area AA12 on the substrate 10 to an area of the first edge sub-area AA12 is from 5% to 10%.

In a specific implementation, the first central sub-area AA11 is provided with a plurality of first spacers 51. The plurality of first spacers 51 may be uniformly distributed in the first central sub-area AA11. The proportion of the total area of the orthographic projections of the first spacers 51 in the first central sub-area AA11 on the substrate 10 to the area of the first central sub-area AA11 may be set according to the requirements of a user. For example, the proportion may be one of 0.1%, 0.3%, 1.0%, 1.5%, 2.4% and 4.0%. Alternatively, the proportion may be ½ times, ¼ times or ⅛ times the proportion of the total area of the orthographic projections of the second spacers 52 in the second display area AA2 on the substrate 10 to the area of the second display area AA2. The proportion of the total area of the orthographic projections of the first spacers 51 in the first edge sub-area AA12 on the substrate 10 to the area of the first edge sub-area AA12 may also be set according to the requirements of a user. For example, the proportion may be one of 4.9%, 5%, 6.5%, 10%. Alternatively, the proportion may be, but is not limited to, ½ times, ¼ times, or ⅛ times the proportion of the total area of the orthographic projections of the second spacers 52 in the second display area AA2 on the substrate 10 to the area of the second display area AA2.

Figure 7:
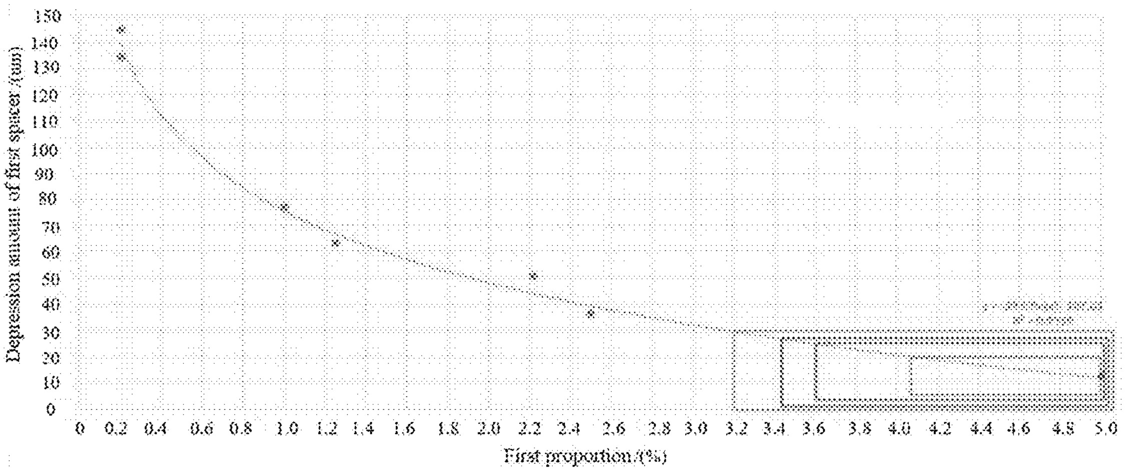
FIG. 7 is a graph of a relationship between a first proportion of the first display area occupied by first spacers and a depression amount of the first spacers according to an embodiment of the present application.
Figure 8:
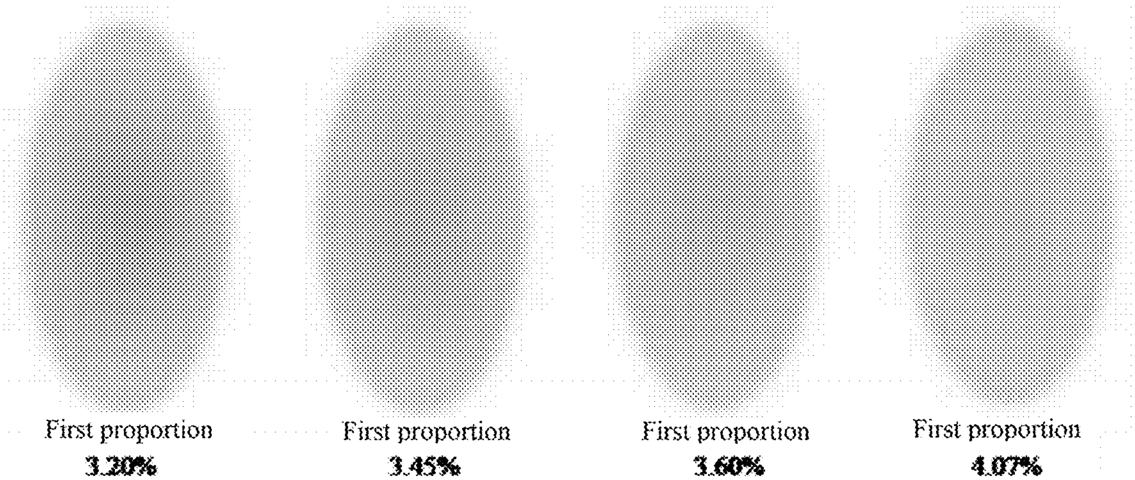
FIG. 8 is a schematic view of display effects under different first proportions of the first display area occupied by first spacers.

In order to verify that the above arrangement of the first spacers 51 can improve the support strength of the display panel 100 while reducing the Newton's ring phenomenon, reference is made to FIG. 7 and FIG. 8. FIG. 7 shows a graph illustrating a relationship between a first proportion of the first display area occupied by first spacers and a depression amount of the first spacers according to an embodiment of the present application. FIG. 8 shows a schematic view illustrating display effects under different first proportions of the first display area occupied by first spacers. In FIG. 7 and FIG. 8, the second proportion of the total area of the orthographic projections of the second spacers 52 in the second display area AA2 on the substrate 10 to the area of the second display area AA2 is 11%. From the simulation results, it can be seen that, with the increase of the first proportion, the depression amount of the first spacer 51 gradually decreases. At this time, it can be seen from FIG. 8 that, when the first proportion is 3.20%, 3.45%, 3.60% and 4.07%, the Newton's ring phenomenon can be effectively mitigated, and when the first proportion is 4.07%, there is almost no Newton's ring phenomenon. Therefore, the display panel 100 provided by the embodiments of the present application can not only improve the overall strength, but also has a desired display effect.

Further, in order to verify the rationality of the simulation results and further verify that the arrangement of the first spacers 51 can improve the support strength of the display panel 100 while reducing the Newton's ring phenomenon, the following description is made with reference to the experimental data shown in Table 1.

As shown in Table 1, by appropriately arranging the occupation proportion by the first spacers 51 in the first display area AA1 and the proportion of the second spacers 52 in the second display area AA2, the maximum depression amount of the first spacers 51 can be effectively reduced, so that the depression amount of portions of the cover plate 70 in the first display area AA1 and the second display area AA2 are similar, and thus the surface of the first spacer 51 facing away from the substrate 10 is flush with the surface of the second spacer 52 facing away from the substrate 10, so as to effectively mitigate the Newton's ring phenomenon and improve the display effect of the display panel 100.

TABLE 1

| Number | First proportion/(%) | Second proportion/(%) | Maximum depression amount of first spacer/(nm) |
|---|---|---|---|
| 1 | 0.20 | 11 | 91.10 |
| 2 | 1 | 11 | 18.00 |
| 3 | 5 | 11 | 0.44 |
| 4 | 0.2 | 15 | 132.5 |

As shown in FIG. 6, in order to increase the support strength of the first spacers 51 such that the strength of the first display area AA1 is uniform with the strength of the second display area AA2, the first spacers 51 may include an annular spacer centered on the center of the first display area AA1, in which case an orthographic projection of the first spacer 51 on the substrate 10 is an annular shape surrounding the center of the first display area AA1. The annular shape herein means a closed structure having an inner edge and an outer edge in a broad sense, and may be any one of a circular ring, a square ring or a polygonal ring. The inner edge and the outer edge of the orthographic projection of the first spacer 51 on the first substrate 11 may be concentrically arranged to define the annular shape.

Figure 9:
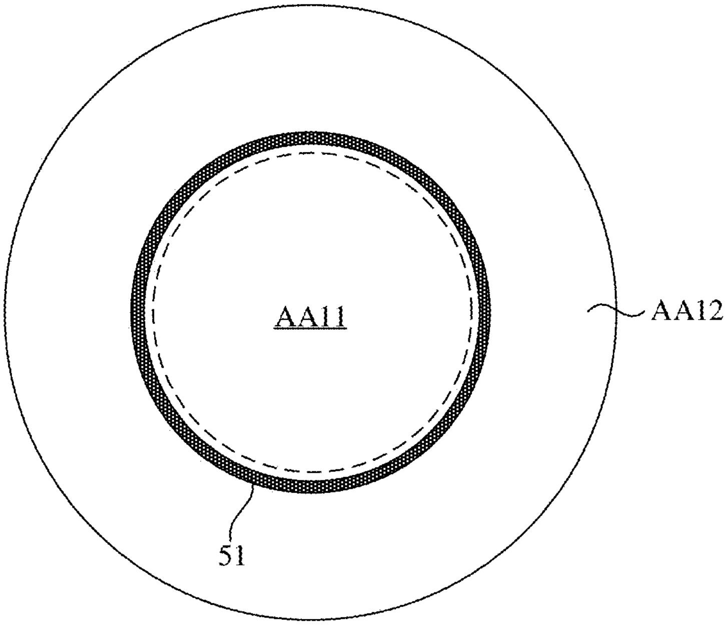
FIG. 9 is a schematic structural view of an example of a first spacer according to an embodiment of the present application.
Figure 10:
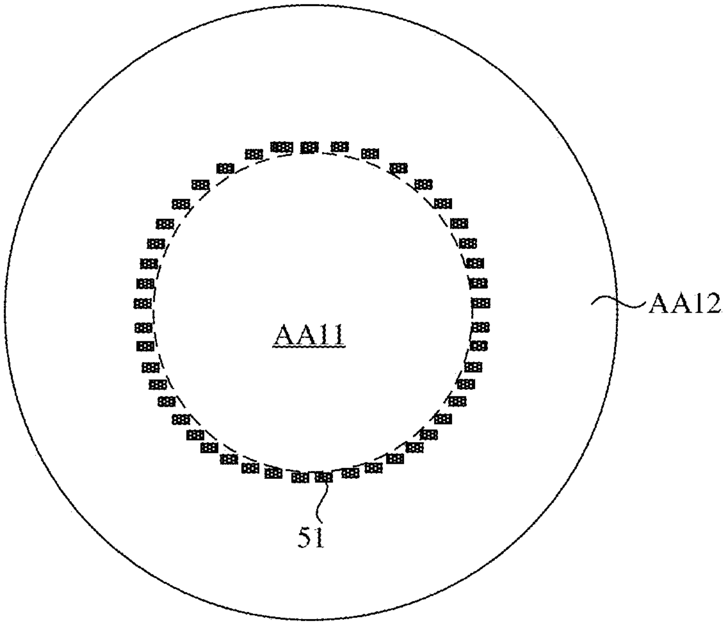
FIG. 10 is a schematic structural view of a first spacer provided by a comparative example 2.

In order to explain that the annular spacer has a high support strength, a comparative example 2 is explained below. Reference is made to FIG. 9 and FIG. 10. FIG. 9 is a schematic structural view of an example of a first spacer according to an embodiment of the present application. FIG. 10 is a schematic structural view of a first spacer provided by a comparative example 2. In the comparative example 2, each first spacers 51 is an individual column-shaped spacer. A plurality of first spacers 51 are arranged at intervals along an outer circumference of the first central sub-area AA11, while the first spacer 51 provided by this embodiment of the present application is a closed annular structure extending along the outer circumference of the first central sub-area AA11. The comparison results of the comparative example 2 and this embodiment of the present application are shown in Table 2 below. It can be seen from table 2 that, the annular spacer provided by this embodiment of the present application can effectively reduce the depression amount of the first spacer 51 when subjected to the depression action of the cover plate 70, and due to the annular spacer provided by this embodiment of the present application, the depression amount of the cover plate 70 in the first display area AA1 is also significantly reduced.

TABLE 2

| Test item | Comparative example 2 | This embodiment |
|---|---|---|
| Depression amount of first spacer | 70 nm | 19 nm |
| Deformation amount of cover plate | 533 nm | 240 nm |

In order to appropriately arrange the first spacer 51 to prevent the first spacer 51 from obstructing the sub-pixel display of the first display area AA1, in some embodiments, the annular spacer includes at least two arc-shaped sub-spacers spaced apart from each other. With the above arrangement, the annular spacer may be provided without affecting an aperture ratio of sub-pixels, and continuously extending arc-shaped sub-spacers are provided to improve the support strength of the display panel 100.

In some embodiments, a backside of the display panel 100 corresponding to the first central sub-area AA11 may be integrated with a photosensitive component, and in order to reduce the influence of the annular spacer on the light transmittance of the first central sub-area AA11, the annular spacer is positioned in the first edge sub-area AA12, in which case a desired support strength of the first display area AA1 can be ensured. Optionally, the first spacers 51 further includes a column-shaped spacer positioned in the first central sub-area AA11, and the light transmittance of the first central sub-area AA11 is increased on the premise of increasing the strength of the first central sub-area AA11.

In some embodiments, at least a part of the first spacers 51 are doped with rigid bars 511 and/or rigid particles 512. Optionally, the first display area AA1 includes a first central sub-area AA11 and a first edge sub-area AA12 surrounding the first central sub-area AA11, and first spacers 51 in the first edge sub-area AA12 are doped with rigid bars and/or rigid particles. Optionally, a material of the rigid bars 511 is at least one of silicon, titanium, steel and a fiber-reinforced composite material; or, a material of the rigid particles 512 is at least one of silicon, titanium, steel, and a fiber reinforced composite material. With the above arrangement, the rigidity of each first spacer 51 can be improved and the first spacers 51 can be prevented from being deformed or broken. In addition, the rigid bars or rigid particles may have a certain light shielding property, so that they are provided in the first spacers 51 in the first edge sub-area AA12, which can improve the light transmittance while ensuring a desired support strength of the first spacers 51.

When the display panel 100 is a rigid display panel, in order to ensure a desired support strength of the display panel 100, the proportion of the total area of the orthographic projections of the second spacers 52 in the second display area AA2 on the substrate 10 to the area of the second display area AA2 may be from 11% to 25%. With the above arrangement, the pressure resistance of the second display area AA2 can be effectively improved, and the second spacers 52 can more effectively support the cover plate 70 to improve the strength of the rigid display panel. Optionally, the second spacers 52 may be uniformly distributed in the second display area AA2 so that the pressure resistance of the second display area AA2 is more uniform, or the second spacers 52 may also include an annular spacer structure so that the support strength of the second display area AA2 meets the design requirements.

Optionally, the second display area AA2 includes a second central sub-area and a second edge sub-area. The second edge sub-area is positioned on at least a part of an outer circumference-side of the second central sub-area AA21. A proportion of a total area of orthographic projections of second spacers 52 in the second central sub-area on the substrate 10 to an area of the second central sub-area is greater than a proportion of a total area of orthographic projections of second spacers 52 in the second edge sub-area on the substrate 10 to an area of the second edge sub-area. By appropriately arranging the distribution of the second spacers 52, the second spacers 52 in the second central sub-area and the second edge sub-area cooperate with each other to better support the cover plate 70, so that the support strength of the second display area AA2 meets the requirements.

Optionally, the first display area AA1 includes a first central sub-area AA11 and a first edge sub-area AA12 surrounding the first central sub-area AA11. A proportion of a total area of orthographic projections of second spacers 52 in the second edge sub-area on the substrate to an area of the second edge sub-area is greater than a proportion of a total area of orthographic projections of first spacers 51 of the first edge sub-area AA12 on the substrate to an area of the first edge sub-area AA12, ensuring a desired light transmittance of the first display area.

Further, in order to effectively improve the light transmittance of the first display area AA1 of the display panel 100 and avoid the influence of the first spacer 51 on the light transmittance of the first display area AA1, in some embodiments, a shape of the orthographic projection of the first spacer 51 on the substrate 10 includes a curved profile. Optionally, the orthographic projection of the first spacer 51 on the substrate 10 is at least one of a circle, an ellipse, a dumbbell shape, and a gourd shape. With the above arrangement, the first spacer 51 is made smooth at its boundary, and the influence of the first spacer 51 having a corner on the transmitted light in the first display area AA1 is prevented, thereby improving a diffraction phenomenon in the first display area AA1.

Further, the first spacer 51 and the second spacer 52 are provided in a non-open area of the pixel definition layer 40 to support the display panel 100 while preventing damage to the light-emitting structures in the sub-pixels.

In the manufacturing process of the display panel 100, a mask is generally used to form a film structure of each sub-pixel, and the spacers may also be used to support the mask, preventing the mask from causing damage to the already formed film structure. Further reference is made to FIG. 4. In some embodiments, the display panel 100 includes a first pixel 31 positioned in the first display area AA1. The first pixel 31 includes a plurality of first color first sub-pixels 310*a*, a plurality of second color first sub-pixels 310*b*, and a plurality of third color first sub-pixels 310*c*. By appropriately arranging the first spacers 51, the first spacers 51 can all desirably support the mask, so as to prevent the mask from causing damage to an already film-formed structure.

The display panel 100 further includes a second pixel 32 positioned in the second display area AA2. The second pixel 32 includes a plurality of first color second sub-pixels 320*a*, a plurality of second color second sub-pixels 320*b*, and a plurality of third color second sub-pixels 320*c*. The plurality of first color second sub-pixels 320*a*, the plurality of second color second sub-pixels 320*b*, and the plurality of third color second sub-pixels 320*c* are arrayed along a column direction of the display panel 100. Each second spacer 52 may be disposed between any two of the first color second sub-pixel 320*a*, the second color second sub-pixel 320*b* and the third color second sub-pixel 320*c* arrayed in the column direction to increase the support effect of the second spacers 52.

In some embodiments, the first pixel 31 includes a plurality of first sub-pixels emitting light of different colors. The second pixel 32 includes a plurality of second sub-pixels emitting light of different colors. The first pixel 31 may include a first color first sub-pixel 310*a* emitting red light, a second color first sub-pixel 310*b* emitting green light, and a third color first sub-pixel 310*c* emitting blue light. Similarly, the second pixel 32 of the display panel 100 in the second display area AA2 may include a first color second sub-pixel 320*a* emitting red light, a second color second sub-pixel 320*b* emitting green light, and a third color second sub-pixel 320*c* emitting blue light.

It should be noted that, sub-pixels emitting light of different colors are distinguished by different fill patterns, where sub-pixels emitting light of a same color are drawn using a same fill pattern. The number and the colors of sub-pixels included in each first pixel 31 or each second pixel 32 may be adjusted according to the design requirements of the display panel 100, and thus are not limited to the examples of the embodiments described above. In addition, the arrangement between the sub-pixels in each first pixel 31 and each second pixel 32 is not limited to the examples of the embodiments described above.

Figure 11:
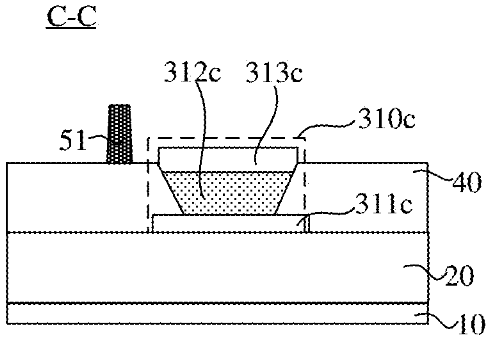
FIG. 11 is a cross-sectional view taken along the direction C-C in FIG. 4.
Figure 12:
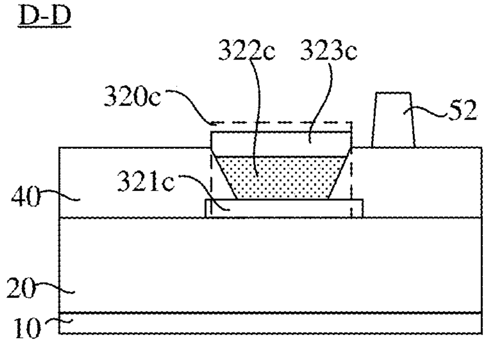
FIG. 12 is a cross-sectional view taken along the direction D-D in FIG. 4.

Further reference is made to FIG. 11 and FIG. 12. FIG. 11 is a cross-sectional view taken along the direction C-C in FIG. 4, FIG. 12 is a cross-sectional view taken along the direction D-D in FIG. 4. Structures of the first color first sub-pixel 310*a*, the second color first sub-pixel 310*b* and the third color first sub-pixel 310*c* are similar, and the third color first sub-pixel 310*c* is described as for illustration herein. In some embodiments, the pixel definition layer 40 includes a first pixel opening, and the third color first sub-pixel 310*c* includes a first light-emitting structure 312*c*, a first electrode 311*c*, and a second electrode 313*c*. The first light-emitting structure 312*c* is positioned in the first pixel opening. The first electrode 311*c* is positioned on a side of the first light-emitting structure 312*c* facing the substrate 10. The second electrode 313*c* is positioned on a side of the first light-emitting structure 312*c* facing away from the substrate 10. An organic material may also be provided between the second electrode 313*c* and the first spacer 51. One of the first electrode 311*c* and the second electrode 313*c* is an anode and the other is a cathode.

The structure of the second sub-pixel is similar to the structure of the first sub-pixel. For example, the pixel definition layer 40 further includes the second pixel opening. The third color second sub-pixel 320*c* includes a second light-emitting structure 322*c*, a third electrode 321*c* and a fourth electrode 323*c*. The second light-emitting structure 322*c* is arranged in the second pixel opening. The third electrode 321*c* is positioned on a side of the second light-emitting structure 322*c* facing the substrate 10. The fourth electrode 323*c* is positioned on a side of the second light emitting structure 322*c* facing away from the substrate 10. An organic material may be provided between the fourth electrode 323*c* and the second support post 52. One of the third electrode 321*c* and the fourth electrode 323*c* is an anode, and the other is a cathode.

In this embodiment, for illustration, the first electrode 311*c* and the third electrode 321*c* will be described as anodes, and the second electrode 313*c* and the fourth electrode 323*c* will be described as cathodes.

In some embodiments, in order to improve the light transmittance of the first display area AA1, the first electrode 311*c* is a light-transmitting electrode, and optionally, the first electrode 311*c* includes an indium tin oxide (ITO) layer or an indium zinc oxide layer.

In some embodiments, the first electrode 311*c* is a reflective electrode and the area of the orthographic projection of the first electrode 311*c* on the substrate 10 is less than the area of the orthographic projection of the third electrode 321*c* on the substrate 10. The first electrode 311*c* may include a first light-transmitting conductive layer, a reflective layer on the first light-transmitting conductive layer, and a second light-transmitting conductive layer on the reflective layer. The first light-transmitting conductive layer and the second light-transmitting conductive layer may be ITO, indium zinc oxide, etc. and the reflective layer may be a metal layer, for example, the reflective layer is made of a silver material.

In some embodiments, the constituent material of the second electrode 313*c* includes magnesium, silver, or a magnesium-silver alloy. The fourth electrode 323*c* may be configured in the same material as the second electrode 313*c*. In some embodiments, the second electrode 313*c* and the fourth electrode 323*c* may be interconnected as a common electrode.

In some embodiments, the orthographic projection of each first light-emitting structure 312*c* on the substrate 10 is composed of one first pattern element or is included of a concatenation of two or more first pattern elements. The first pattern element includes at least one of a circle, an ellipse, a dumbbell shape, a gourd shape, and a rectangle.

In some embodiments, the orthographic projection of each first electrode 311*c* on the substrate 10 is composed of one second pattern element or is composed of a concatenation of more than two second pattern elements. The second pattern element includes at least one of a circle, an ellipse, a dumbbell shape, a gourd shape, and a rectangle. With the above arrangement, the diffraction in the first display area AA1 can be effectively reduced.

In some embodiments, the display panel 100 further includes a device layer 20 between the substrate 10 and the pixel definition layer 40. The device layer 20 includes a plurality of pixel circuit layers and a wiring layer for driving the first color first sub-pixel 310*a*, the second color first sub-pixel 310*b*, the third color first sub-pixel 310*c*, the first color second sub-pixel 320*a*, the second color second sub-pixel 320*b* and the third color second sub-pixel 320*c* to emit light. The wiring layer includes a scanning line, a data line and a power line. The plurality of pixel circuits include at least a switching transistor, a driving transistor and a storage capacitor. The above wiring layer is connected to a plurality of organic light-emitting elements in a display module through the plurality of pixel circuits, thereby driving the organic light-emitting elements to emit light.

In summary, in the display panel 100 provided by the embodiments of the present application, the first display area AA1 is provided as capable of transmitting light, so that the display panel 100 can have a photosensitive component integrated on the backside of the first display area AA1, and the under-screen integration of the photosensitive component such as a camera is realized. The display panel 100 includes the substrate 10, the pixel definition layer 40 and the first spacers 51 on the side of the pixel definition layer 40 facing away from the substrate 10. The first spacers 51 can improve the strength and pressure resistance of the first display area AA1 of the display panel 100, and keep the display panel 100 from problems of poor display effects such as Moire pattern.

Further, the display panel 100 may further include the second display area AA2 and the second spacers 52 in the second display area AA2. The proportion of the total area of the orthographic projections of the first spacers 51 in the first display area AA1 on the substrate 10 to the area of the first display area AA1 is arranged to be less than the proportion of the total area of the orthographic projections of the second spacers 52 in the second display area AA2 on the substrate 10 to the area of the second display area AA2, so that the influence of the first spacers 51 in the first display area AA1 on the light transmittance can be reduced, and the light transmittance of the first display area AA1 can be effectively improved. Furthermore, along the direction from center to edge of the first display area AA1, the first display area AA1 includes at least two sub-areas. The proportion of the total area of the orthographic projections of the first spacers 51 in each sub-area on the substrate 10 to the area of the sub-area is appropriately arranged to be distinct, so that the support strength of the first display area AA1 is ensured to be similar as the support strength of the second display area AA2 and the desired light transmittance of the first display area AA1 can be ensured at the same time. In comparison with the case where the first spacers 51 are uniformly arranged in the first display area AA1, in the display panel 100 provided by the embodiments of the present application, a part of the sub-areas AA10 may be provided with first spacers 51 with a higher density to improve the support strength in the part of the sub-areas AA10, a part of the sub-areas AA10 may be provided with first spacers 51 with a lower density in the part of the sub-areas AA10 to increase the light transmittance in the part of the sub-areas AA10, so as to facilitate the integration of the photosensitive component on the backside of the first display area AA1 and ensure a desired overall strength of the display panel 100, thereby improving the quality of the display panel 100.

In another aspect, the embodiments of the present application further provide a display apparatus including the display panel 100 provided by any one of the above embodiments.

Since the display apparatus provided by the embodiments of the present application includes the display panel 100 provided by any one of the above embodiments, the display apparatus according to the embodiments of the present application has the same advantageous effects as the display panel 100 according to the above embodiments, and can not only realize a full-screen display, but also enable the display panel 100 to have a high light transmittance, and facilitate the under-screen integration of components such as photosensitive components.

In some embodiments, the display panel 100 includes a first surface and a second surface that are opposite, where the first surface is a display surface. The display apparatus further includes a photosensitive component positioned on the side of the second surface of the display panel 100. The photosensitive component corresponds to the first display region AA1 in position.

The photosensitive component may be an image capturing apparatus for capturing external image information. In some embodiments, the photosensitive component may be a complementary metal oxide semiconductor (CMOS) image capturing apparatus. In some other embodiments, the photosensitive component may be a charge-coupled device (CCD) image capturing apparatus or other form of image capturing apparatus. The photosensitive component may not be limited to an image capturing apparatus, for example, in some embodiments, the photosensitive component may be a light sensor such as an infrared sensor, a proximity sensor, an infrared lens, a flood sensing element, an ambient light sensor, and a dot matrix projector. In addition, in the display apparatus, other components may further be integrated on the second surface side of the display panel 100, such as an earpiece, a speaker, etc.

In the display apparatus provided by the embodiments of the application, the first display area AA1 includes a light-transmitting display area, so that the display panel 100 may have a photosensitive component integrated on the backside of the light-transmitting display area to realize the under-screen integration of the photosensitive component such as an image acquiring apparatus, and at the same time, the first display area AA1 can display images. The display area of the display panel 100 is improved and the full-screen design of the display apparatus is realized. At the same time, by appropriately arranging the first spacers 51 in the first display area AA1, a desired pressure resistance of the display panel 100 can be ensured, and the Newton's ring can be prevented from being generated. Those skilled in the art should understand that the above-mentioned embodiments are all illustrative and not restrictive. Different technical features appearing in different embodiments can be combined to achieve beneficial effects. Those skilled in the art should be able to understand and implement other modified embodiments of the disclosed embodiments on the basis of studying the drawings, the description, and the claims. In the claims, the term "including" does not exclude other means or steps; an article is intended to include one or more articles when it is not modified by a quantifier, and may be used interchangeably with "one or more articles"; the terms "first", "second" are used to denote a name and not to denote any particular order. Any reference signs in the claims should not be construed as limiting the protection scope. The functions of several parts appearing in the claims can be realized by a single hardware or software module. The presence of certain technical features in different dependent claims does not mean that these technical features cannot be combined to obtain beneficial effects.

What is claimed is:

1. A display panel comprising a first display area, which is a light-transmitting display area, the first display area comprising:

a first central sub-area centered on a center of the first display area; and a first edge sub-area being an annular area surrounding the first central sub-area;

a substrate;

a pixel definition layer disposed on the substrate and including a plurality of sub-pixels arranged in columns along a column direction of the display panel;

a plurality of first spacers disposed on a side of the pixel definition layer facing away from the substrate and positioned in the first central sub-area and the first edge sub-area, wherein:

each of the first spacers is disposed between two adjacent sub-pixels in a same column, a proportion of a total area of orthographic projections of the plurality of first spacers in the first central sub-area on the substrate to an area of the first central sub-area is greater than a proportion of a total area of orthographic projections of the plurality of first spacers in the first edge sub-area on the substrate to an area of the first edge sub-area, and the plurality of first spacers in the first edge sub-area is doped with at least one of rigid bars and rigid particles.

2. The display panel according to claim 1, further comprising:

a cover plate disposed on a side of the plurality of first spacers facing away from the substrate.

3. The display panel according to claim 1, wherein, along the direction from center to edge of the first display area, a width from a center of the first central sub-area to an edge of the first central sub-area is the same as a width from a first edge of the first edge sub-area to a second edge of the first edge sub-area.

4. The display panel according to claim 1, wherein an area of an orthographic projection of a first spacer in the first central sub-area on the substrate is greater than an area of an orthographic projection of a first spacer in the first edge sub-area; or a number of first spacers per unit area in the first central sub-area is greater than a number of first spacers per unit area in the first edge sub-area.

5. The display panel according to claim 1, wherein a proportion of a total area of orthographic projections of the plurality of first spacers in the first edge sub-area on the substrate to an area of the first edge sub-area is from 5% to 10%.

6. The display panel according to claim 1, wherein the plurality of first spacers further comprises:

an annular spacer centered on the center of the first display area.

7. The display panel according to claim 1, wherein a material of the rigid bars or the rigid particles is at least one of silicon, titanium, steel, and a fiber-reinforced composite material.

8. The display panel according to claim 1, further comprising:

a second display area adjoining the first display area, a light transmittance of the second display area being less than a light transmittance of the first display area;

a plurality of second spacers positioned in the second display area; wherein a proportion of a total area of orthographic projections of the plurality of first spacers on the substrate to an area of the first display area is a first proportion, a proportion of a total area of orthographic projections of the plurality of second spacers on the substrate to an area of the second display area is a second proportion, and the first proportion is less than the second proportion.

9. A display apparatus comprising the display panel according to claim 1.

10. The display panel according to claim 1, wherein:

the pixel definition layer comprises a non-opening area and a plurality of pixel openings, the plurality of first spacers is disposed on the non-opening area, organic light-emitting structures of the plurality of sub-pixels are disposed in the plurality of pixel openings, and each sub-pixel of the plurality of sub-pixels further comprises:

a first electrode located on a side of the organic light-emitting structure of each sub-pixel facing the substrate and a second electrode located on a side of the organic light-emitting structure of each sub-pixel away from the substrate.

11. The display panel according to claim 6, wherein the annular spacer is positioned in the first edge sub-area.

12. The display panel according to claim 11, wherein the plurality of first spacers further comprises:

a column-shaped spacer positioned in the first central sub-area.

13. The display panel according to claim 8, wherein the proportion of the total area of orthographic projections of the plurality of second spacers on the substrate to the area of the second display area is from 11% to 25%.

14. The display panel according to claim 8, wherein the second display area further comprises:

a second central sub-area and a second edge sub-area on at least a part of an outer circumference of the second central sub-area, and a proportion of a total area of orthographic projections of the plurality of second spacers in the second central sub-area on the substrate to an area of the second central sub-area is greater than a proportion of a total area of orthographic projections of the plurality of second spacers in the second edge sub-area on the substrate to an area of the second edge sub-area.

15. The display panel according to claim 8, wherein the second display area further comprises:

a second central sub-area and a second edge sub-area on at least a part of an outer circumference of the second central sub-area, and a proportion of a total area of orthographic projections of the plurality of second spacers in the second central sub-area on the substrate to an area of the second edge sub-area is greater than a proportion of a total area of orthographic projections of the plurality of first spacers in the first edge sub-area on the substrate to an area of the first edge sub-area.

16. The display panel according to claim 8, wherein a side of at least one first spacer of the plurality of first spacers faces away from the substrate and a side of at least one second spacer of the plurality of second spacers faces away from the substrate is flush in a thickness direction of the display panel.

* * * * *